United States Patent
Noll et al.

(10) Patent No.: US 10,785,073 B1
(45) Date of Patent: Sep. 22, 2020

(54) PWM SIGNALING AND ENCODING MULTIPLE STATUSES

(71) Applicant: Hamilton Sundstrand Corporation, Charlotte, NC (US)

(72) Inventors: Christopher Brian Noll, Glastonbury, CT (US); Jeffrey A. Eldridge, Ellington, CT (US); Steven A. Avritch, Bristol, CT (US); Peter Martin Gilbert, Phoenix, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/443,078

(22) Filed: Jun. 17, 2019

(51) Int. Cl.
| | |
|---|---|
| *H03K 7/08* | (2006.01) |
| *H04L 25/49* | (2006.01) |
| *G05B 19/05* | (2006.01) |
| *G06F 7/575* | (2006.01) |
| *G05B 19/045* | (2006.01) |

(52) U.S. Cl.
CPC ........ *H04L 25/4902* (2013.01); *G05B 19/045* (2013.01); *G05B 19/054* (2013.01); *G06F 7/575* (2013.01); *H03K 7/08* (2013.01)

(58) Field of Classification Search
CPC . H04L 25/4902; G05B 19/045; G05B 19/054; G06F 7/575; H03K 7/08
USPC .......................................................... 375/238
See application file for complete search history.

(56) References Cited

U.S. PATENT DOCUMENTS

| | | | | |
|---|---|---|---|---|
| 5,023,535 | A * | 6/1991 | Miller | G05B 11/28 318/599 |
| 5,534,889 | A * | 7/1996 | Reents | G09G 3/36 345/89 |
| 5,754,436 | A * | 5/1998 | Walsh | G06F 1/3203 700/286 |
| 5,764,024 | A * | 6/1998 | Wilson | H02M 7/53873 318/805 |
| 7,564,874 | B2 | 7/2009 | King | |
| 8,599,915 | B2 | 12/2013 | Zhao et al. | |
| 8,929,431 | B2 | 1/2015 | Kashima et al. | |
| 10,104,725 | B2 | 10/2018 | Kim | |
| 2015/0002117 | A1 | 1/2015 | Labib et al. | |
| 2017/0149365 | A1* | 5/2017 | Burger | H02P 27/08 |
| 2017/0315568 | A1* | 11/2017 | Lovicott | G05D 23/1919 |

OTHER PUBLICATIONS

RS-422 PWM Discrete In; CC Server in From Left, HSER 27829; dated Apr. 16, 2008; 3 pages.
Extended European Search Report dated May 26, 2020, received for corresponding European Application No. 19210124.4, 9 pages.
Pulse-width modulation, Wikipedia, Apr. 9, 2020, 11 pages.

* cited by examiner

*Primary Examiner* — Helene E Tayong
(74) *Attorney, Agent, or Firm* — Kinney & Lange, P.A.

(57) ABSTRACT

A pulse width modulation signaling system includes a first control channel that is configured to receive a hardware Boolean command input from a first hardware status monitor, receive a software multi-bit command input from a first software system, and generate a first pulse width modulated signal that is representative of the Boolean command input and the software multi-bit command input. The hardware Boolean command input is a binary value of either a first state or a second state, the software multi-bit command input includes a binary value of either a first state or a second state, and the first pulse width modulated signal defines a duty cycle.

20 Claims, 7 Drawing Sheets

Hardware State / Duty Cycle

| Degrade | Sync Status | Auton. Mode | 0 (unsevered) | 1 (severed) |
|---------|-------------|-------------|---------------|-------------|
| 0 | 0 | 0 | 75% | 25% |
| 0 | 0 | 1 | 73% | 23% |
| 0 | 1 | 0 | 71% | 21% |
| 0 | 1 | 1 | 69% | 19% |
| 1 | 0 | 0 | 67% | 17% |
| 1 | 0 | 1 | 65% | 15% |
| 1 | 1 | 0 | 63% | 13% |
| 1 | 1 | 1 | 61% | 11% |

Software State

PWM SIGNALING AND ENCODING MULTIPLE STATUSES

BACKGROUND

The present disclosure relates generally to data transmission, and in particular, to the transmission of system status using pulse width modulation.

Pulse width modulation (PWM) can be used to signal the status of a hardware component in an aircraft, where a high degree of signal reliability is preferable. For example, a first PWM duty cycle can be used to indicate that a sensor is available, and a second PWM duty cycle can be used to indicate that the sensor is unavailable, or severed. Accordingly, a PWM signaling scheme can be used to provide a two-state status of a particular hardware component. In some settings, it could be beneficial to signal one or more statuses in addition to providing a two-state status of a particular hardware component.

SUMMARY

A pulse width modulation signaling system includes a first control channel that is configured to receive a hardware Boolean command input from a first hardware status monitor, receive a software multi-bit command input from a first software system, and generate a first pulse width modulated signal that is representative of the Boolean command input and the software multi-bit command input. The hardware Boolean command input is a binary value of either a first state or a second state, the software multi-bit command input comprises a binary value of either a first state or a second state, and the first pulse width modulated signal defines a duty cycle.

A method for using a modulation signaling system that includes a first control channel for generating a first pulse width modulated signal that is representative of a Boolean command input and a software multi-bit command input includes receiving a hardware Boolean command input from a first hardware status monitor, receiving a software multi-bit command input from a first software system, and generating the first pulse width modulated signal. The hardware Boolean command input is a binary value of either a first state or a second state, the software multi-bit command input comprises a binary value of either a first state or a second state, and the first pulse width modulated signal defines a duty cycle.

DETAILED DESCRIPTION

Figure 1:
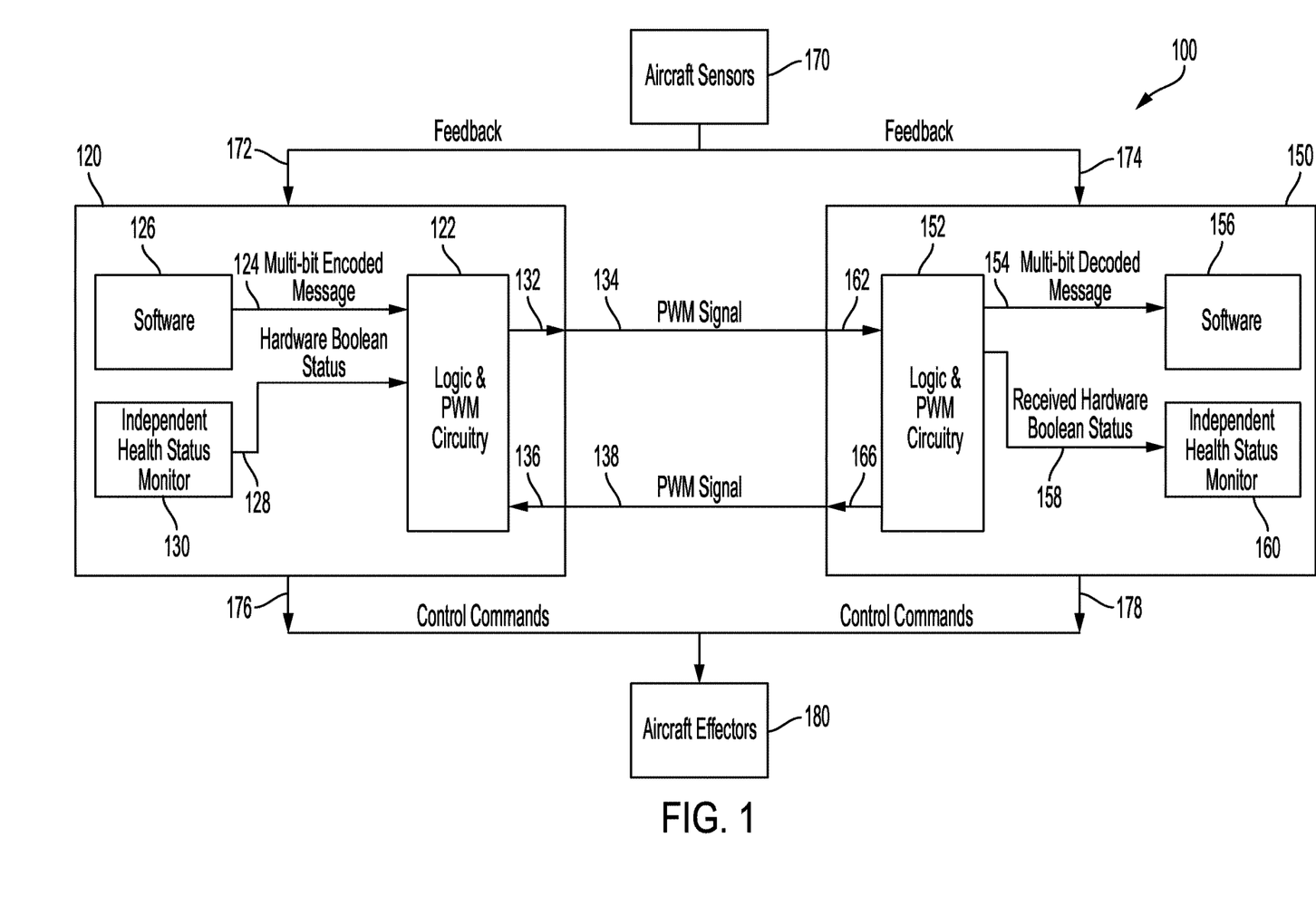
FIG. 1 is schematic diagram of a multi-bit pulse width modulation signaling system.
Figure 2:
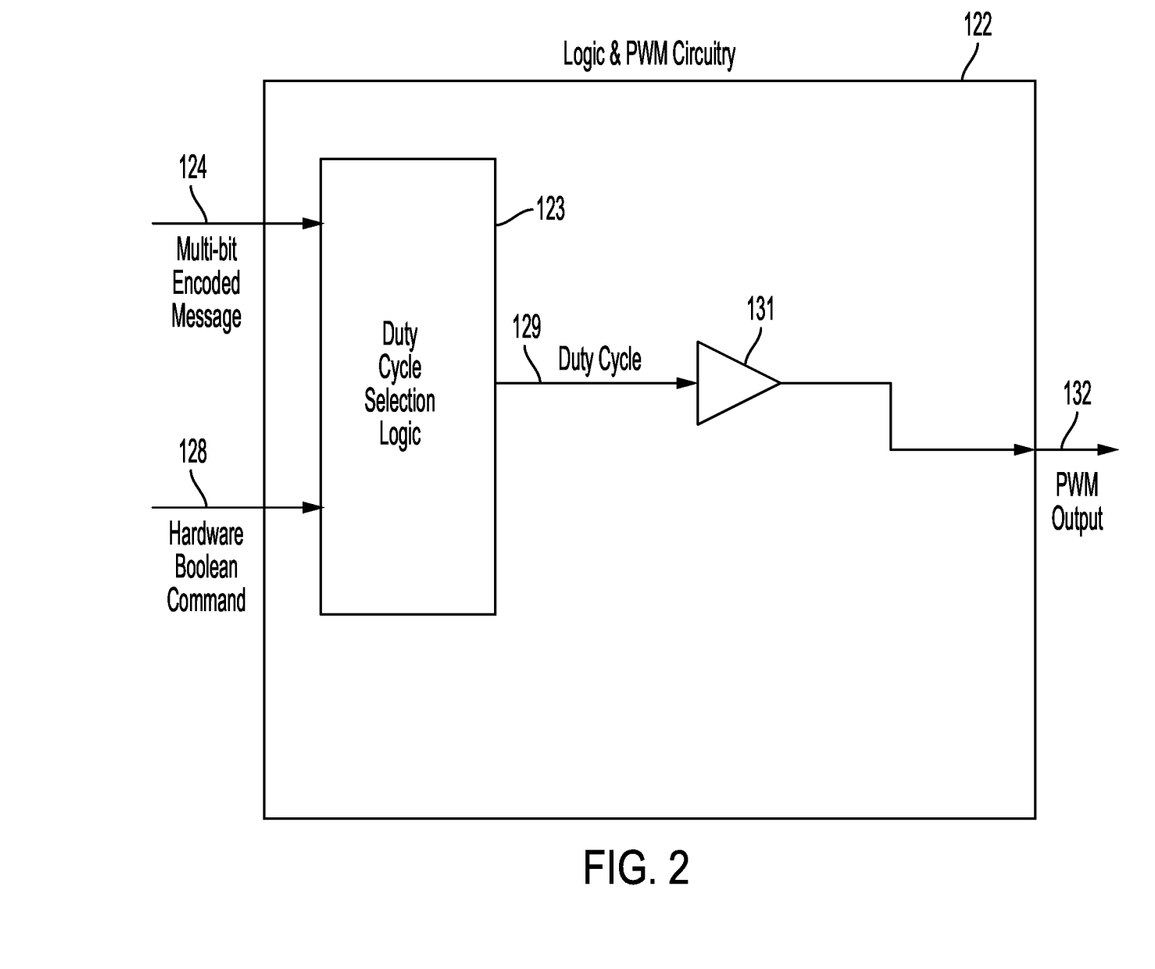
FIG. 2 is schematic diagram of a multi-bit logic channel for the multi-bit pulse width modulation signaling system shown in FIG. 1.

FIG. 1 is schematic diagram of a multi-bit pulse width modulation signaling system. FIG. 2 is schematic diagram of a multi-bit logic channel for the multi-bit pulse width modulation signaling system shown in FIG. 1. Shown in FIGS. 1-2 are pulse width modulation (PWM) signaling system 100, first control channel 120, first logic channel 122, multi-bit duty cycle selection logic circuit 123, software multi-bit command input 124, first software system 126, hardware Boolean command input 128, multi-bit duty cycle selection logic circuit output 129, first health status monitor 130, amplifier 131, first channel PWM output 132, first PWM signal 134, first channel PWM input 136, second PWM signal 138, second control channel 150, second logic channel 152, software multi-bit signal 154, second software system 156, hardware Boolean status signal 158, second health status monitor 160, second channel PWM input 162, second channel PWM output 166, aircraft sensors 170, aircraft sensors first channel feedback 172, aircraft sensors second channel feedback 174, first channel control commands 176, second channel control commands 178, and aircraft effectors 180. PWM signaling system 100 includes first control channel 120 and second control channel 150, described as follows.

First control channel 120 can be used for signaling the status of a hardware component on an aircraft (not shown), while also signaling multiple software-detected statuses of the associated hardware component. A computer is a non-limiting example of a hardware component. The hardware status can be unsevered (i.e., connected, available) or severed (i.e., disconnected, unavailable). Non-limiting examples of software-detected statuses of the associated hardware component include performance level (e.g., degraded or non-degraded) and synchronism (i.e., sync) status (e.g., sync or non-sync). First control channel 120 includes first logic channel 122 which receives software multi-bit command input 124 from first software system 126, and hardware Boolean command input 128 from first health status monitor 130. First logic channel 122 includes multi-bit duty cycle selection logic circuit 123 (shown in FIG. 3), which receives software multi-bit command input 124 and hardware Boolean command input 128. First logic channel 122 provides multi-bit duty cycle selection logic circuit output 129 to amplifier 131, which in turn provides first channel PWM output 132. Multi-bit duty cycle selection logic circuit 123 operates as a pulse frequency of about 5,000 Hz. In some embodiments, the pulse frequency can range from about 4,000-6,000 Hz. In other embodiments, the pulse frequency can range from about 500-20,000 Hz. Amplifier 131 provides first channel PWM output 132 at a voltage level of about ±6 volts peak-to-peak. In some embodiments, the voltage level of first channel PWM output 132 can range from about ±2 volts peak-to-peak to about ±6 volts peak-to-peak. In other embodiments, the voltage level of first channel PWM output 132 can be outside of these exemplary ranges.

Referring again to FIG. 2, hardware Boolean command input 128 is representative of the severed/unsevered status of the hardware component. In the illustrated embodiment, hardware Boolean command input 128 of 0 indicates the associated hardware component is unsevered (i.e., connected, available), and hardware Boolean command input 128 of 1 indicates the associated hardware component is severed (i.e., disconnected, unavailable). The respective values of 0 and 1 can be referred to as binary values, or as a first state and second state, respectively. Software multi-bit command input 124 is a multi-bit word (i.e., binary word) that is received from first software system 126. In the illustrated embodiment, software multi-bit command input 124 is a two-bit word, with the first indicative of the hardware system performance level (e.g., degraded or non-degraded), and the second bit indicative of the hardware sync status (e.g., sync or non-sync). As used in the present disclosure, bits in a multi-bit word are referred to in the order as presented from left to right. First control channel 120 provides first PWM signal 134 from first channel PWM output 132. First control channel 120 also receives second PWM signal 138 at first channel PWM input 136.

Second control channel 150 receives first PWM signal 134 at second channel PWM input 162. Second control channel 150 includes second logic channel 152 which decodes first PWM signal 134 to provide software multi-bit signal 154 to second software system 156, and to provide hardware Boolean status signal 158 to second health status monitor 160. Second control channel 150 also provides second PWM signal from second channel PWM output 166.

In the illustrated embodiment, first channel 120 and second channel 150 continuously exchange the status information contained in PWM signals 134, 138 to ensure that first channel 120 and second channel 150 are each aware of the operational status of the other. By using information received from the other channel, first channel 120 and second channel 150 can provide adjustments to their respective control algorithms to maintain appropriate control of aircraft effectors 180. In some embodiments, first channel 120 and second channel 150 can exchange status information periodically (i.e., non-continuously). In other embodiments, first channel 120 and second channel 150 can operate independently, without exchanging status information.

Referring again to FIG. 1, aircraft sensors 170 are various sensors that provide control algorithm feedback information that is used in calculating control commands 176, 178, to be provided to aircraft effectors 180. Non-limiting examples of aircraft sensors include air data (e.g., airspeed, altitude, angle of attack), temperature (e.g., thermocouple, resistance temperature detector), and position sensors (e.g., linear variable differential transformer, rotary variable differential transformer).

First and second health status monitors 130, 160 each represent independent circuitry that monitors the health of the control channel's ability to properly process feedback 172, 174 and develop correct control commands, 176, 178. Non-limiting examples of elements that are part of this logic include watchdog timers, clock monitors, or other built-in-test circuitry that confirms the channel is capable of properly operating. The role of this function is to provide and independent element that forces a channel into a sever (i.e., disconnect) state if a fault is detected within the respective first or second control channel 120, 150 that prevents the proper generation of control commands 176, 178.

Aircraft effectors 180 are various effectors (i.e., active elements, actuators) that can alter a state of a system in response to a command (e.g., control commands 176, 178). In the illustrated embodiment, aircraft effectors 180 are commanded by control commands 176, 178 that are produced by the respective first or second control channel 120, 150 to position a flight control surface in an orientation that complies with the command (i.e., thereby achieving the desired aircraft orientation). Non-limiting examples of aircraft effectors 180 include hydraulic actuators and servo motors that position control surfaces on an aircraft wing.

In the illustrated embodiment, PWM signaling system 100 can include one or more processors (not shown in FIGS. 2-3) that are configured to implement functionality and/or process instructions for execution within PWM signaling system 100. For instance, the one or more prognostic processor(s) can be capable of processing instructions stored in one or more storage device(s) (not shown in FIGS. 2-3). Examples of processor(s) can include any one or more of a microprocessor, a controller, a digital signal processor (DSP), an application specific integrated circuit (ASIC), a field-programmable gate array (FPGA), or other equivalent discrete or integrated logic circuitry. In some embodiments, PWM signaling system 100 can utilize data and signal analysis processing techniques different from and/or in addition to those described herein.

In a particular embodiment, PWM signaling system 100 can include only first control channel 120 that is configured to receive software multi-bit command input 124 and hardware Boolean command input 128, and to provide first PWM signal 134. In this particular embodiment, PWM signaling system 100 can be configured to provide PWM signaling of hardware and multi-bit software command status to an external system.

Figure 3:
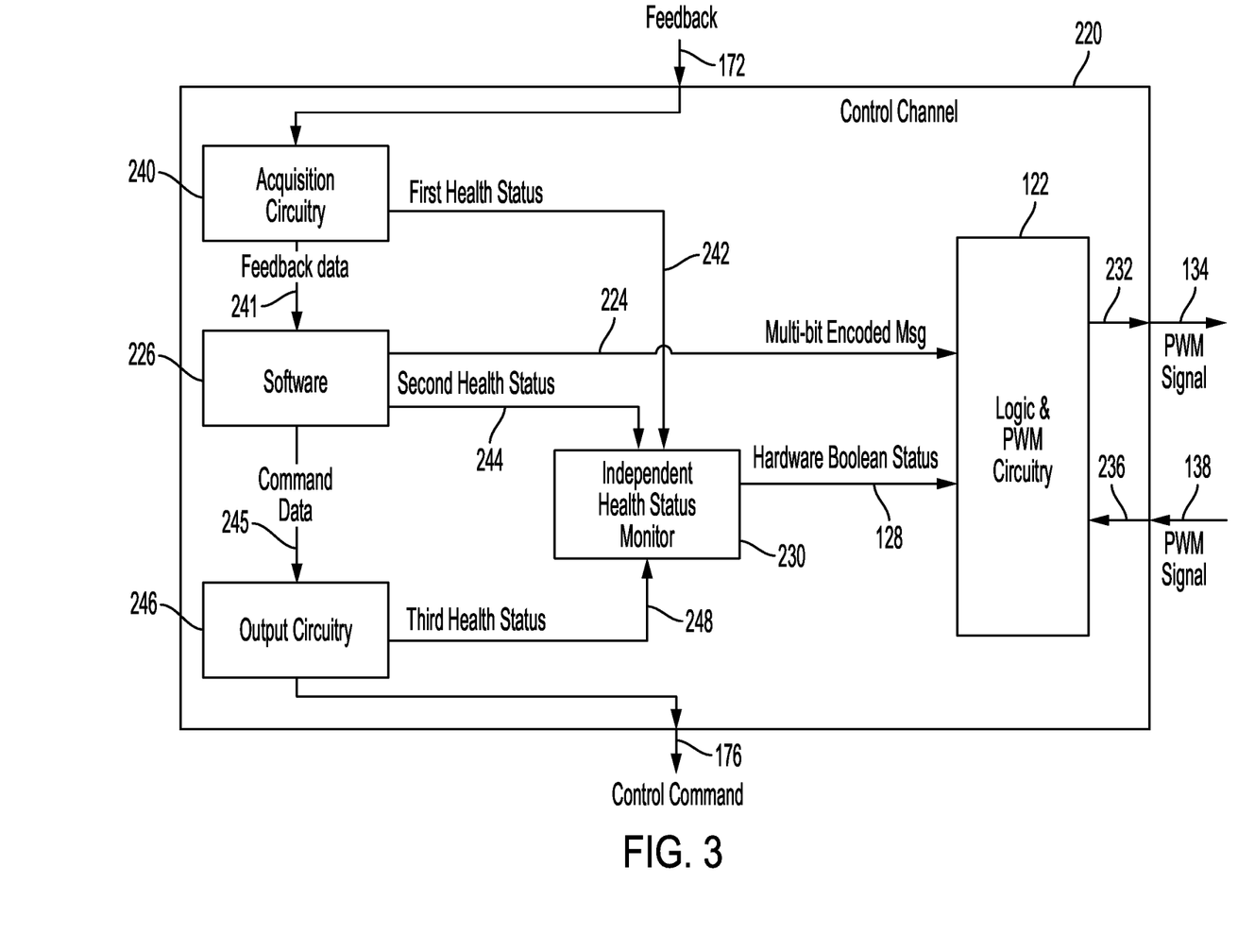
FIG. 3 is a second embodiment of a control channel for the multi-bit pulse width modulation signaling system shown in FIG. 1.

FIG. 3 is a second embodiment of a control channel for the multi-bit pulse width modulation signaling system shown in FIG. 1. Shown in FIG. 3 are first PWM signal 134, second PWM signal 138, aircraft sensors first channel feedback 172, first channel control commands 176, first control channel 220, first logic channel 222, software multi-bit command input 224, first software system 226, hardware Boolean command input 228, independent health status monitor 230, first channel PWM output 232, first channel PWM input 236, acquisition circuitry 240, feedback data 241, first health status signal 242, second health status signal 244, command data 245, output circuitry 246, and third health status signal 248. The descriptions of first PWM signal 134, second PWM signal 138, aircraft sensors first channel feedback 172, and first channel control commands 176 are as provided above in regard to FIGS. 1-2. The descriptions of first logic channel 222, software multi-bit command input 224, first software system 226, hardware Boolean command input 228, first health status monitor 230, first channel PWM output 232, and first channel PWM input 236 are substantially as provided above in regard to FIGS. 1-2. Acquisition circuitry 240 acquires and processes aircraft sensors first channel feedback 172 to produce feedback data 241 and first health status signal 242. In some embodiments, acquisition circuitry 240 can include analog-to-digital converter (ADC) circuits that digitize analog signals contained in aircraft sensors first channel feedback 172. Feedback data 241 are provided to first software system 226, which produces software multi-bit command input 224 (i.e., as described above in regard to FIGS. 1-2). First software system 226 also produces second health status signal 244 and command data 245. Command data 245 are provided to output circuitry 246, which in turn produces first channel control commands 176. Output circuitry 246 also produces third health status signal 248. First health status signal 242, second health status signal 244, and third health status signal 248, each being representative of various health status indications that are processed within first control channel 220, are all provided to first health status monitor 230. In turn, first health status monitor 230 calculates hardware Boolean command input 228, which is provided to first logic channel 222 (i.e., as described above).

Figure 4:
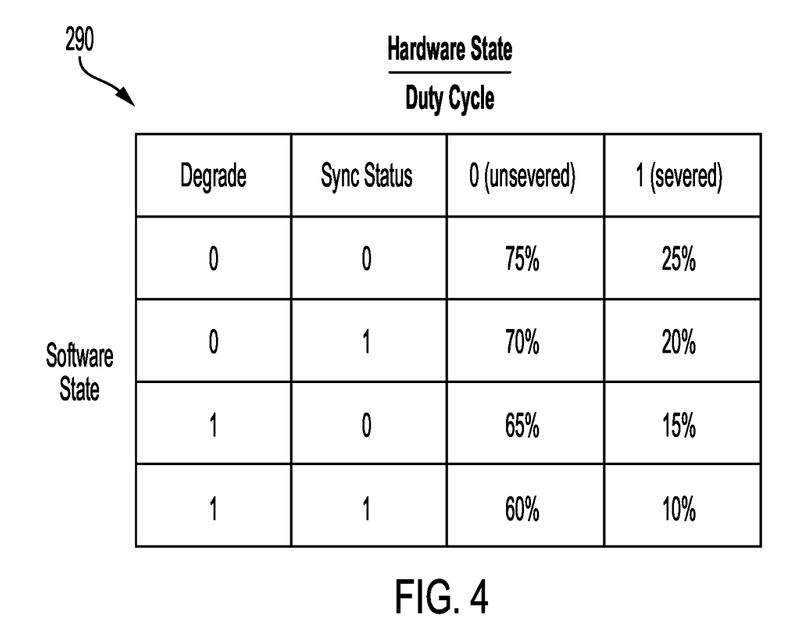
FIG. 4 is a multi-bit duty cycle table using two bits for the multi-bit pulse width modulation signaling system shown in FIG. 1.

FIG. 4 is a multi-bit duty cycle table using two bits for multi-bit pulse width modulation signaling system 100 shown in FIG. 1. Shown in FIG. 4 is two-bit duty cycle state table 290, which can be used to describe first PWM signal 134 (shown in FIGS. 1 and 3), in an exemplary condition as follows. The first (i.e., left-most) bit represents a degraded (i.e., degrade) status, notifying the other (i.e., remote) remote channel(s) when the control channel is commanding aircraft effectors at a reduced level of effectiveness. In this condition, degrade=true (i.e., 0), and a hardware Boolean command is true (i.e., 0, unsevered. A degrade status can be indicative of one or more non-critical fault conditions. The second (i.e., second left-most) bit represents a synchronization (i.e., synchronized, sync) status between first and second control channels 120, 150. When first and second control channels 120, 150 are synchronized, the variance between channels for feedback and control command is less than when first and second control channels 120, 150 are not synchronized. This can be referred to as tight tolerance. The first (i.e., left-most) bit can also be referred to as the most significant bit (MSB). Similarly, the right-most bit (i.e., second bit in the illustrated embodiment) can be referred to as the least-significant bit (LSB).

When software multi-bit command input is 00, PWM duty cycle is either 75% or 25%, corresponding to a hardware state of unsevered or severed, respectively. This can be referred to as an unmodified PWM duty cycle. It is beneficial to convey additional information to other channels in conjunction with the sever state, particularly in the "unsevered" state. As an example, it is beneficial at the system level to indicate that a channel is unsevered, but not synchronized to the other channel(s). This would allow the remote channel(s) to adjust error detection mechanisms to a wider range to accommodate the lack of synchronization between channels. Additional information that is beneficial in PWM signaling system 100 is the status of flight control mode. This indication would be used by the remote channel(s) as a stimulus to adjust control algorithms to align with the remote channel and operate collectively in a coordinated fashion. Accordingly, the conveyance of various software states during severed hardware status (i.e., hardware Boolean status 128=severed), as demonstrated in the present disclosure, can be of great benefit in the operation of an aircraft having PWM signaling system 100.

In the illustrated embodiment, discrete values are provided for the various PWM duty cycles. In the illustrated embodiment, first and second logic channels 122, 152 are capable of providing a PWM signal that is accurate to ±0.5 percentage points (% p). Accordingly, a PWM duty cycle that is rounded to the nearest whole-integer percentage point (% p) can be referred to as being approximately equal to a particular PWM duty cycle. For example, if first PWM signal 134 has a PWM duty cycle that ranges from 59.5-60.5%, then first PWM signal 134 can be said to have a PWM duty approximately equal to 60%, thereby representing a hardware state of 0 (i.e., unsevered), and a two-bit software state of 11 (i.e., degraded and synchronized). Accordingly, if first PWM signal 134 has a PWM duty cycle that is outside of the tolerance range of ±0.5 percentage points (% p), then am invalid status is indicated. In some embodiments of PWM signaling system 100, the PWM duty cycle tolerance range can be either narrower (i.e., tighter) or wider (i.e., looser) than ±0.5% p. In a second exemplary embodiment, the PWM duty cycle tolerance range can be ±2% p. Accordingly, in this second exemplary embodiment, if first PWM signal 134 has a PWM duty cycle that ranges from 58-62%, then first PWM signal 134 can be said to have a PWM duty approximately equal to 60%. It is to be appreciated that the PWM duty cycle tolerance in a particular embodiment of PWM signaling system 100 can be arbitrarily established by the designer based on several possible design considerations. For example, the electronic components and circuitry used in a particular embodiment can be a design consideration. It is also to be appreciated that the PWM duty cycle tolerance, and particularly, the maximum tolerance range, can be a function of the number of bits used in software multi-bit command input 124, and accordingly, the corresponding number different PWM duty cycle levels.

Figure 5:
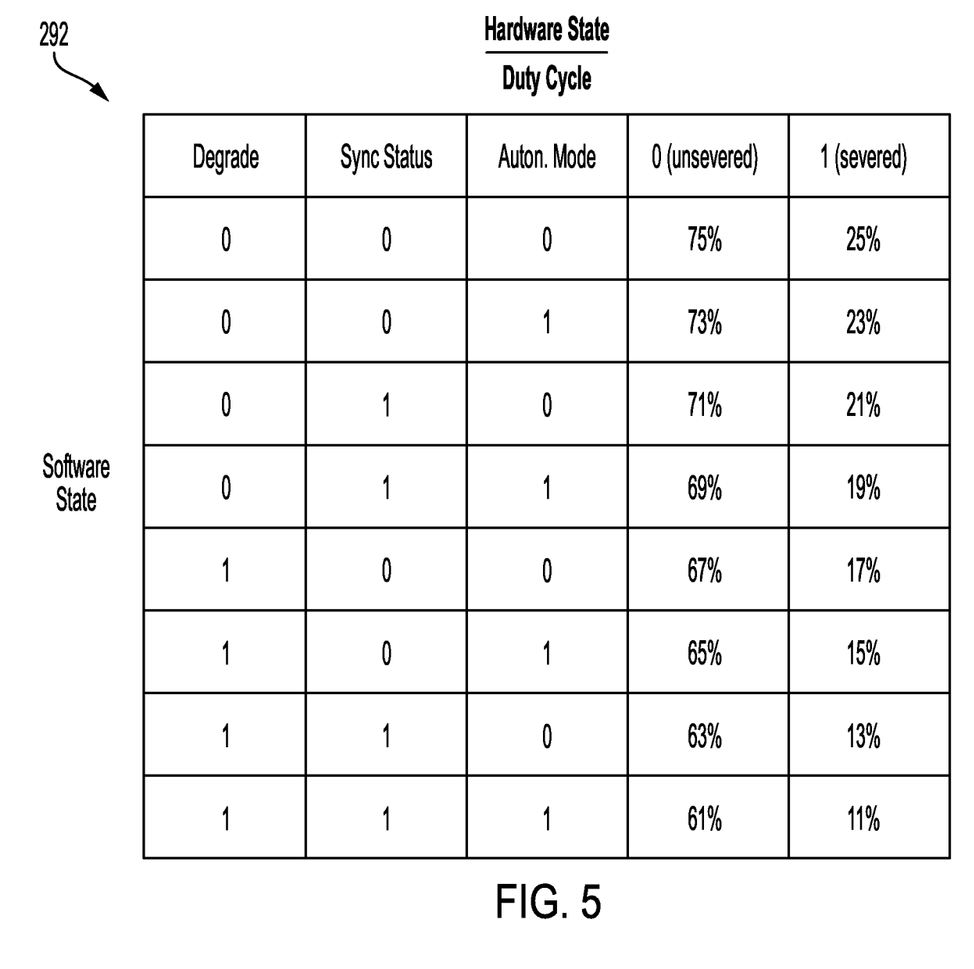
FIG. 5 is multi-bit duty cycle table using three bits for a second embodiment of the multi-bit pulse width modulation signaling system shown in FIG. 1.

FIG. 5 is multi-bit duty cycle table using three bits for a second embodiment of control channel 220 shown in FIG. 3. Shown in FIG. 5 is three-bit duty cycle state table 292, which can be used to describe first PWM signal 134 in signaling three exemplary software states as follows. The first (i.e., left-most) bit represents degraded (i.e., degrade) status, the second (i.e., second left-most) bit represents synchronism (i.e., sync) status, and the third (i.e., third left-most) bit represents autonomous (i.e., "auton") mode operation. Degraded and sync status are substantially similar to those described above in regard to FIG. Autonomous status can be representative of a representative of a flight control mode (e.g., autonomous flight control mode or direct flight control mode.

In other embodiments, various bits of software multi-bit command input 124 can be representative of other software-detected conditions, with non-limiting examples including various equipment condition flags relating to the performance of a built-in test, whether the equipment is on the ground or in the air, whether an equipment temperature is exceeding a particular limit, and whether or not external feedback data are being properly received. In yet other embodiments, more than three bits can be used in software multi-bit command input 124 and therefore be encoded in first and/or second PWM signals 134, 138, with all numbers of bits being within the scope of the present disclosure. As noted above in regard to FIG. 4, a tighter PWM duty cycle tolerance band can be typically associated with a greater number of bits. Accordingly, in a practical embodiment, any number of bits can be used within the ability of the associated electronic components and circuitry that encode and decode PWM signals.

Figure 6:
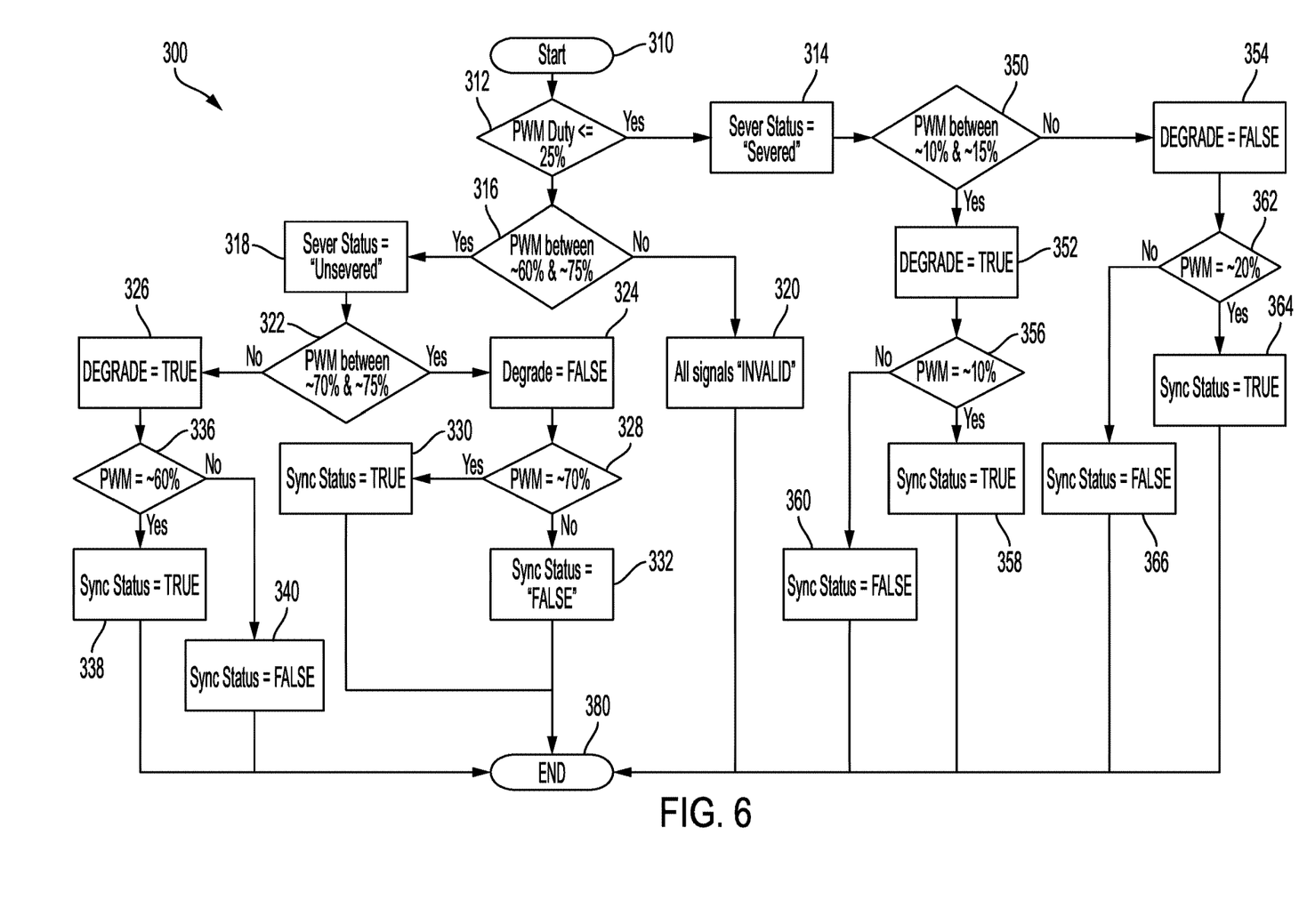
FIG. 6 is a process flow diagram for the multi-bit pulse width modulation signaling system shown in FIG. 4.

FIG. 6 is a process flow diagram for the multi-bit pulse width modulation signaling system shown in FIG. 3. Shown in FIG. 6 are two-bit duty cycle process flow diagram 300, start step 310, make PWM duty cycle (DC) <25% decision 312, severed status condition 314, make PWM DC 60% -75% decision 316, unsevered status condition 318, invalid signal condition 320, make PWM DC 70% -75% decision 322, degrade false condition 324, degrade true condition 326, make PWM DC=70% decision 328, sync status true condition 330, sync status false condition 332, make PWM DC=60% decision 336, sync status true condition 338, sync status false condition 340, make PWM DC 10% -15% decision 350, degrade true condition 352, degrade false condition 354, make PWM DC=10% decision 356, sync status true condition 358, sync status false condition 360, make PWM DC=20% decision 362, sync status true condition 364, sync status false condition 366, and end step 380. The operation of first control channel 120 can be characterized stepping through two-bit duty cycle process flow chart 300. Beginning at start step 300, a series of decisions are made based on the received PWM duty cycle, thereby establishing the value of various conditions associated with hardware Boolean status (i.e., severed or unsevered), and with various software status flags associated with each bit of software multi-bit command input 124 (e.g., degrade status, sync status). It is to be appreciated that first control channel 120 and second control channel 150 each independently perform two-bit duty cycle process flow chart 300 to decode corresponding second PWM signal 138 and first PWM signal 134, respectively, while exchanging data with the other as described above in regard to FIGS. 1 and 4.

Referring again to FIG. 6, in some embodiments, first and second control channels 120, 150 can periodically perform two-bit duty cycle process flow chart 300 by beginning again at start step 310. In an exemplary embodiment, a timing signal (i.e., clock pulse) can be applied to that first control channel 120 and/or second control channel 150 to periodically invoke the performance of two-bit duty cycle process flow chart 300. By periodically re-performing two-bit duty cycle process flow chart 300, first and/or second control channels 120, 150 can respond to changing conditions. In another exemplary embodiment, first and/or second control channels 120, 150 can commanded to perform two-bit duty cycle process flow chart 300 by beginning again at start step 310 upon the receipt of a triggering signal.

Figure 7:
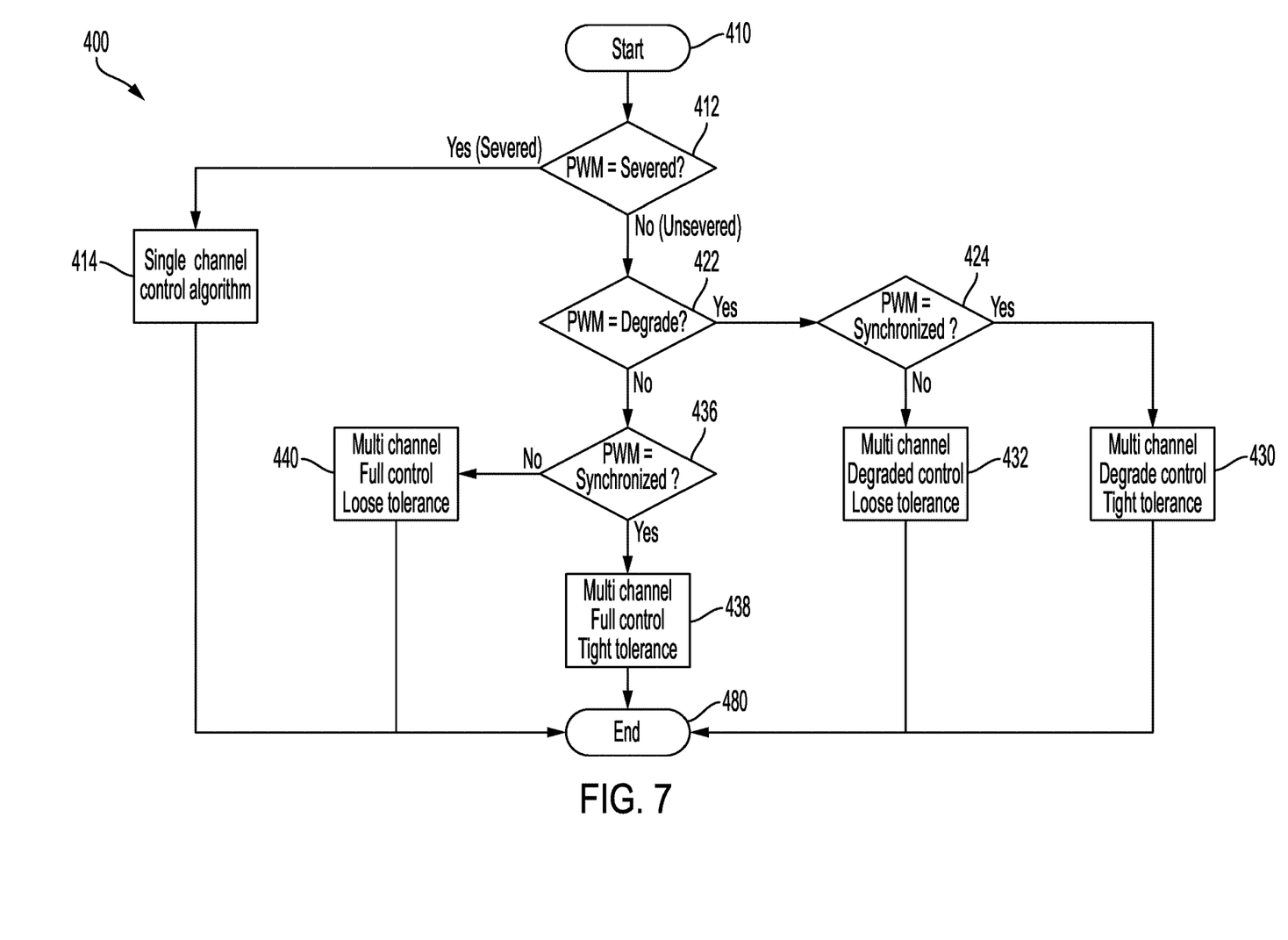
FIG. 7 is a process flow diagram for a second embodiment of the multi-bit pulse width modulation signaling system depicted in FIG. 4.

FIG. 7 is a process flow diagram for a second embodiment of multi-bit pulse width modulation signaling system 100 depicted as two-bit duty cycle state table 292 in FIG. 4. Shown in FIG. 7 are two-bit duty cycle process flow chart 400, start step 410, make severed status decision 412, single channel control algorithm 414, make degraded condition decision 422, make synchronized condition decision 424, multi-channel degraded control with tight tolerance operation 430, multi-channel degraded control with loose tolerance operation 432, make synchronized condition decision 436, multi-channel full control with tight tolerance operation 438, multi-channel full control with loose tolerance operation 440, and end step 480. It is to be appreciated that two-bit duty cycle process flow chart 400 presents the functional equivalents of decisions pertaining to PWM duty cycle values as depicted as two-bit duty cycle state table 292 in FIG. 4. The description of various aspects of are two-bit duty cycle process flow chart 400 are substantially as provided above in regard to FIG. 6, including exemplary descriptions of various timing schemes for the performance/re-performance of start step 410.

The present disclosure describes PWM signaling system 100 in terms of Boolean or binary values, which are represented as values of either 0 or 1. It is to be appreciated that binary signals refer to two-state values as used with logic circuitry. These two states (i.e., 0 and 1) can be referred to as a first state and a second state, respectively or irrespectively. This is to say that inverse values to those shown and described herein are within the scope of the present disclosure. For example, in the embodiment shown in FIGS. 2-5, hardware Boolean command input 128 was represented as 0 to signify unsevered status. In another embodiment, 1 can represent unsevered status. Accordingly, a first state and a second state can be used to represent values of hardware Boolean command input 128.

Discussion of Possible Embodiments

The following are non-exclusive descriptions of possible embodiments of the present invention.

A pulse width modulation signaling system comprising a first control channel, the first control channel configured to: receive a hardware Boolean command input from a first hardware status monitor; wherein the hardware Boolean command input is a binary value of either a first state or a second state; receive a software multi-bit command input from a first software system; wherein the software multi-bit command input comprises a binary value of either a first state or a second state; and generate a first pulse width modulated signal that is representative of the Boolean command input and the software multi-bit command input; wherein the first pulse width modulated signal defines a duty cycle.

The pulse width modulation signaling system of the preceding paragraph can optionally include, additionally and/or alternatively, any one or more of the following features, configurations and/or additional components:

A further embodiment of the pulse width modulation signaling system, wherein: the hardware Boolean command input is selected from the group consisting of a first state and a second state; the first state is representative of an unsevered first hardware status monitor status; and the second state is representative of a severed first hardware status monitor status.

A further embodiment of the pulse width modulation signaling system, wherein: the software multi-bit command input comprises a first bit and a second bit; the first bit is a binary value either 0 or 1; and the second bit is a binary value either 0 or 1.

A further embodiment of the pulse width modulation signaling system, wherein: the software multi-bit command input comprises a third bit; and the third bit is a binary value either 0 or 1.

A further embodiment of the pulse width modulation signaling system, wherein: the hardware Boolean command input is a first state; the first hardware status monitor status is unsevered; and the duty cycle ranges from about 60-75%; wherein: the duty cycle is indicative of the two-bit binary word.

A further embodiment of the pulse width modulation signaling system, wherein: the hardware Boolean command input is a second state; the first hardware status monitor status is severed; and the duty cycle ranges from about 10-55%; wherein: the duty cycle is indicative of the two-bit binary word.

A further embodiment of the pulse width modulation signaling system, further comprising a second control channel, the second control channel configured to: receive the first pulse width modulated signal; generate a hardware Boolean status signal representative of the first pulse width modulated signal, the hardware Boolean status signal indicative of the hardware Boolean command input; and generate a software multi-bit signal representative of the first pulse width modulated signal, the software multi-bit signal indicative of the software multi-bit command input.

A further embodiment of the pulse width modulation signaling system, wherein: the second control channel is configured to generate a second PWM signal; and the second PWM signal is communicatively coupled to the first control channel.

A further embodiment of the pulse width modulation signaling system, wherein: the duty cycle defines a percentage point value; the percentage point value is a whole integer; and the whole integer ranged from 10 percentage points to 90 percentage points.

A further embodiment of the pulse width modulation signaling system, wherein: the software multi-bit command input is indicative of a software-detected equipment condition; and the software-detected equipment condition is selected from the group consisting of degraded operation condition, synchronized operation condition, and autonomous operation condition.

A further embodiment of the pulse width modulation signaling system, wherein the first control channel is further configured to receive one or more feedback signals from one or more sensors, each of the one or more feedback signals being associated with a sensor; wherein each of the one or more sensors is selected from the group consisting of an air data sensor, a temperature sensor, and a position sensor.

A further embodiment of the pulse width modulation signaling system, wherein the first control channel is further configured to provide one or more control commands to one or more effectors, each of the one or more control commands being associated with an effector; wherein each of the one or more effectors is selected from the group consisting of a hydraulic actuator and a servo motor.

A further embodiment of the pulse width modulation signaling system, wherein: the first pulse width modulated signal defines a pulse frequency; and the pulse frequency ranges from 500-20,000 Hz.

A further embodiment of the pulse width modulation signaling system, wherein the pulse frequency ranges from 4,000-6,000 Hz.

A method for using a modulation signaling system comprising a first control channel for generating a first pulse width modulated signal that is representative of a Boolean command input and a software multi-bit command input, the method comprising: receiving a hardware Boolean command input from a first hardware status monitor; wherein the hardware Boolean command input is a binary value of either a first state or a second state; receiving a software multi-bit command input from a first software system; wherein the software multi-bit command input comprises a binary value of either a first state or a second state; and generating the first pulse width modulated signal; wherein the first pulse width modulated signal defines a duty cycle.

The method of the preceding paragraph can optionally include, additionally and/or alternatively, any one or more of the following features, configurations and/or additional components:

A further embodiment of the method, wherein: the hardware Boolean command input is selected from the group consisting of a first state and a second state; the first state is representative of an unsevered first hardware status monitor status; and the second state is representative of a severed first hardware status monitor status.

A further embodiment of the method, wherein: the software multi-bit command input comprises a first bit and a second bit; the first bit is a binary value either 0 or 1; and the second bit is a binary value either 0 or 1.

A further embodiment of the method, wherein: the hardware Boolean command input is a first state; the first hardware status monitor status is unsevered; and the duty cycle ranges from about 60-75%; wherein: the duty cycle is indicative of the two-bit binary word.

A further embodiment of the method, wherein: the hardware Boolean command input is a second state; the first hardware status monitor status is severed; and the duty cycle ranges from about 10-55%; wherein: the duty cycle is indicative of the two-bit binary word.

A further embodiment of the method, wherein: the software multi-bit command input is indicative of a software-detected equipment condition; and the software-detected equipment condition is selected from the group consisting of degraded operation condition, synchronized operation condition, and autonomous operation condition.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A pulse width modulation signaling system comprising a first control channel, the first control channel configured to:
   receive a hardware Boolean command input from a first hardware status monitor, wherein:
      the hardware Boolean command input is a binary value of either a first state or a second state;
      the first state is representative of an unsevered first hardware status monitor status; and
      the second state is representative of a severed first hardware status monitor status;
   receive a software multi-bit command input from a first software system, wherein:
      the software multi-bit command input comprises a first bit and a second bit;
      the first bit is a binary value either 0 or 1; and
      the second bit is a binary value either 0 or 1; and
   generate a first pulse width modulated signal that is representative of the Boolean command input and the software multi-bit command input; wherein;
      the first pulse width modulated signal defines a duty cycle;
      the duty cycle is indicative of the software multi-bit command input; and
      the duty cycle ranges from 60-75% if the hardware Boolean command input is the first state.

2. The pulse width modulation signaling system of claim 1, wherein:
   the software multi-bit command input further comprises a third bit; and
   the third bit is a binary value either 0 or 1.

3. The pulse width modulation signaling system of claim 1, wherein the duty cycle ranges from 10-55% if the hardware Boolean command input is the second state.

4. The pulse width modulation signaling system of claim 1, wherein:
   the duty cycle defines a percentage point value;
   the percentage point value is a whole integer; and
   the whole integer ranges from 10 percentage points to 90 percentage points.

5. The pulse width modulation signaling system of claim 1, wherein:
   the software multi-bit command input is indicative of a software-detected equipment condition; and
   the software-detected equipment condition is selected from the group consisting of degraded operation condition, synchronized operation condition, and autonomous operation condition.

6. The pulse width modulation signaling system of claim 1, wherein the first control channel is further configured to receive one or more feedback signals from one or more sensors, each of the one or more feedback signals being associated with a sensor;
   wherein each of the one or more sensors is selected from the group consisting of an air data sensor, a temperature sensor, and a position sensor.

7. The pulse width modulation signaling system of claim 1, wherein the first control channel is further configured to provide one or more control commands to one or more effectors, each of the one or more control commands being associated with an effector;
wherein each of the one or more effectors is selected from the group consisting of a hydraulic actuator and a servo motor.

8. The pulse width modulation signaling system of claim 1, wherein:
the first pulse width modulated signal defines a pulse frequency; and
the pulse frequency ranges from 500-20,000 Hz.

9. The pulse width modulation signaling system of claim 8, wherein the pulse frequency ranges from 4,000-6,000 Hz.

10. A pulse width modulation signaling system comprising: a first control channel, the first control channel configured to:
receive a hardware Boolean command input from a first hardware status monitor;
wherein the hardware Boolean command input is a binary value of either a first state or a second state;
receive a software multi-bit command input from a first software system;
wherein the software multi-bit command input comprises a binary value of either a first state or a second state; and
generate a first pulse width modulated (PWM) signal that is representative of the Boolean command input and the software multi-bit command input;
wherein the first pulse width modulated signal defines a duty cycle; and a second control channel, the second control channel configured to: receive the first pulse width modulated signal;
generate a hardware Boolean status signal representative of the first pulse width modulated signal, the hardware Boolean status signal indicative of the hardware Boolean command input; and
generate a software multi-bit signal representative of the first pulse width modulated signal, the software multi-bit signal indicative of the software multi-bit command input.

11. The pulse width modulation system of claim 10, wherein:
the second control channel is configured to generate a second PWM signal; and
the second PWM signal is communicatively coupled to the first control channel.

12. The pulse width modulation signaling system of claim 10, wherein:
the software multi-bit command input comprises a first bit and a second bit;
the first bit is a binary value either 0 or 1; and
the second bit is a binary value either 0 or 1.

13. The pulse width modulation signaling system of claim 12, wherein:
the software multi-bit command input further comprises a third bit; and
the third bit is a binary value either 0 or 1.

14. The pulse width modulation signaling system of claim 10, wherein:
the duty cycle is indicative of the multi-bit binary word;
the duty cycle ranges from 60-75% if the hardware Boolean command input is the first state; and
the duty cycle ranges from 10-55% if the hardware Boolean command input is the second state.

15. The pulse width modulation signaling system of claim 10, wherein:
the software multi-bit command input is indicative of a software-detected equipment condition; and
the software-detected equipment condition is selected from the group consisting of degraded operation condition, synchronized operation condition, and autonomous operation condition.

16. The pulse width modulation signaling system of claim 10, wherein:
the first pulse width modulated signal defines a pulse frequency; and
the pulse frequency ranges from 500-20,000 Hz.

17. A method for using a modulation signaling system comprising a first control channel for generating a first pulse width modulated signal that is representative of a Boolean command input and a software multi-bit command input, the method comprising:
receiving a hardware Boolean command input from a first hardware status monitor, wherein:
the hardware Boolean command input is a binary value of either a first state or a second state;
the first state is representative of an unsevered first hardware status monitor status: and
the second state is representative of a severed first hardware status monitor status:
receiving a software multi-bit command input from a first software system, wherein:
the software multi-bit command input comprises a first bit and a second bit;
the first bit is a binary value either 0 or 1; and
the second bit is a binary value either 0 or 1; and
generating the first pulse width modulated signal, that is representative of the Boolean command input and the software multi-bit command input, wherein the first pulse width modulated signal defines a duty cycle;
the duty cycle is indicative of the software multi-bit command input; and
the duty cycle ranges from 60-75% if the hardware Boolean command input is the first state.

18. The method of claim 17, wherein the duty cycle ranges from 10-55% if the hardware Boolean command input is the second state.

19. The method of claim 17, wherein:
the software multi-bit command input is indicative of a software-detected equipment condition; and
the software-detected equipment condition is selected from the group consisting of degraded operation condition, synchronized operation condition, and autonomous operation condition.

20. The method of claim 17, wherein:
the software multi-bit command input is indicative of a software-detected equipment condition; and
the software-detected equipment condition is selected from the group consisting of degraded operation condition, synchronized operation condition, and autonomous operation condition.

* * * * *